United States Patent [19]
Lentz et al.

[11] Patent Number: 4,459,548
[45] Date of Patent: Jul. 10, 1984

[54] ALTERNATOR TESTING APPARATUS

[75] Inventors: Richard P. Lentz, Kenosha; Stephen B. Servais, Franksville, both of Wis.

[73] Assignee: Snap-on Tools Corporation, Kenosha, Wis.

[21] Appl. No.: 320,329

[22] Filed: Nov. 12, 1981

[51] Int. Cl.³ .......................................... G01R 31/02
[52] U.S. Cl. ...................... 324/158 MG; 324/158 D; 324/384; 363/46
[58] Field of Search ...... 324/158 MG, 158 D, 140 D, 324/379, 384; 322/99; 340/645; 363/46

[56] References Cited

U.S. PATENT DOCUMENTS

| | | |
|---|---|---|
| 2,123,859 | 7/1938 | Winograd . |
| 3,502,983 | 3/1970 | Ingle et al. . |
| 3,629,704 | 12/1971 | Stevens .......................... 324/158 MG |
| 3,893,029 | 7/1975 | Vensel et al. . |
| 3,977,239 | 8/1976 | Hulls et al. . |
| 3,978,416 | 8/1976 | Sutphin, Jr. . |
| 3,978,719 | 9/1976 | Hadden et al. . |
| 3,981,586 | 9/1976 | Scott . |
| 4,045,732 | 8/1977 | Yashiro et al. . |
| 4,070,624 | 1/1978 | Taylor . |
| 4,086,531 | 4/1978 | Bernier . |
| 4,145,653 | 3/1979 | Voigt . |
| 4,156,845 | 5/1979 | Muellner et al. . |
| 4,163,227 | 7/1979 | Sawada et al. . |
| 4,178,546 | 12/1979 | Hulls et al. . |
| 4,211,971 | 7/1980 | Kobayashi et al. . |
| 4,211,973 | 7/1980 | Sato et al. . |
| 4,315,204 | 2/1982 | Sievers et al. .............. 324/158 MG |
| 4,348,629 | 9/1982 | Sievers . |
| 4,379,990 | 4/1983 | Sievers . |

Primary Examiner—Stewart J. Levy
Attorney, Agent, or Firm—Emrich & Dithmar

[57] ABSTRACT

An alternator produces current that has an average component and a ripple component. The alternator testing apparatus produces one voltage representative of the magnitude of the peak-to-peak amplitude of the ripple component and a second voltage representative of the sum of the average component and the peak-to-peak amplitude of the ripple component. A series of comparators each have their signal inputs coupled to receive the first voltage and their control inputs coupled to a divider network which is in turn coupled to receive the second voltage. Indicators are coupled to the comparators.

23 Claims, 4 Drawing Figures

ALTERNATOR TESTING APPARATUS

BACKGROUND OF THE INVENTION

A vehicular storage battery provides DC power for engine start-up and the like. The vehicle has an alternator which is mechanically driven by the operating engine to provide current for charging the battery. The alternator includes a diode network for converting the AC to DC. The alternator is usually three phase in nature, so that the diode network includes three pairs of diodes, each pair providing the DC for approximately one third of the cycle, with a ripple therein. So long as the diodes are functioning properly, the amount of ripple normally encountered in the alternator output waveform is rather small. If one or more of the charging diodes should fail, such as due to vibration, shock, electrical burn out or the like, the alternator output waveform becomes considerably distorted and the ripple amplitude increases since for a substantial portion of each output waveform period, no rectification takes place.

Servicemen use an alternator tester to evaluate the alternator in order to determine whether it is operating properly. Such apparatus commonly has an ammeter to display the amount of average current being delivered by the alternator. A malfunction is indicated when the average current does not meet specifications. One possible cause is one or more defective diodes. As mentioned above, the ripple supplied by a properly operating alternator is small, but increases markedly if one or more of the diodes is defective. Presently available alternator testers have an indicator which displays information as to such ripple amplitude. If the ripple amplitude is excessive, the serviceman would disassemble the alternator and individually evaluate each diode.

Vehicular alternators vary in the amount of current they can deliver, from say 25 amps to 100 amps or more. Ripple of a given amplitude supplied by a high-current alternator may be perfectly acceptable but if present to the same amplitude on a low-current alternator would indicate a defect.

Actually, most alternator testers give a "good/bad" indication and the serviceman does not know the amplitude of the ripple. The tester is calibrated so that if the ripple has an amplitude greater than a certain value then it is bad and if less than such value it is good. Such a tester can be used to evaluate an alternator which has a given current output. An alternator having a different current capability would require a different modified tester.

SUMMARY OF THE INVENTION

It is therefore an important object of the present invention to provide an alternator testing apparatus which gives information on the operation of an alternator irrespective of its current capability.

Another object is to provide an alternator testing apparatus which gives ripple amplitude in terms of its ratio to the sum of the ripple and the average current.

In summary, there is provided alternator testing apparatus for evaluating the operation of an alternator that generates an output signal having an average component and a ripple component, comprising circuit means for generating at a first output thereof a first voltage representative of the amplitude of the ripple component and for generating at a second output thereof a second voltage representative of the sum of the magnitude of the average component plus the amplitude of the ripple component, means for providing electrical signals representative of the ratio of the first voltage to the second voltage, and indicating means coupled to the dividing means and being responsive to the electrical signals therefrom to provide information on the ratio.

In a specific form of the invention, the apparatus comprises first filter means coupled to receive the output signal for passing the ripple component thereof, detector means coupled to the first filter means for generating a first voltage representative of the amplitude of the ripple component, second filter means coupled to receive the output signal for passing the average component, summing means coupled to the detector means and to the second filter means for generating a second voltage representative of the sum of the magnitude of the average component and the amplitude of the ripple component, a plurality of comparators each having a signal input and a reference input and an output, the signal inputs being coupled together and to the detector means, a divider network coupled to the summing means for dividing the second voltage into a plurality of different reference voltages at a plurality of nodes in the network, the nodes being respectively coupled to the reference inputs, each comparator being activated when the first voltage exceeds the reference voltage associated with such comparator, and the indicating means being coupled to the comparator outputs and being energized in accordance with which comparator is activated.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
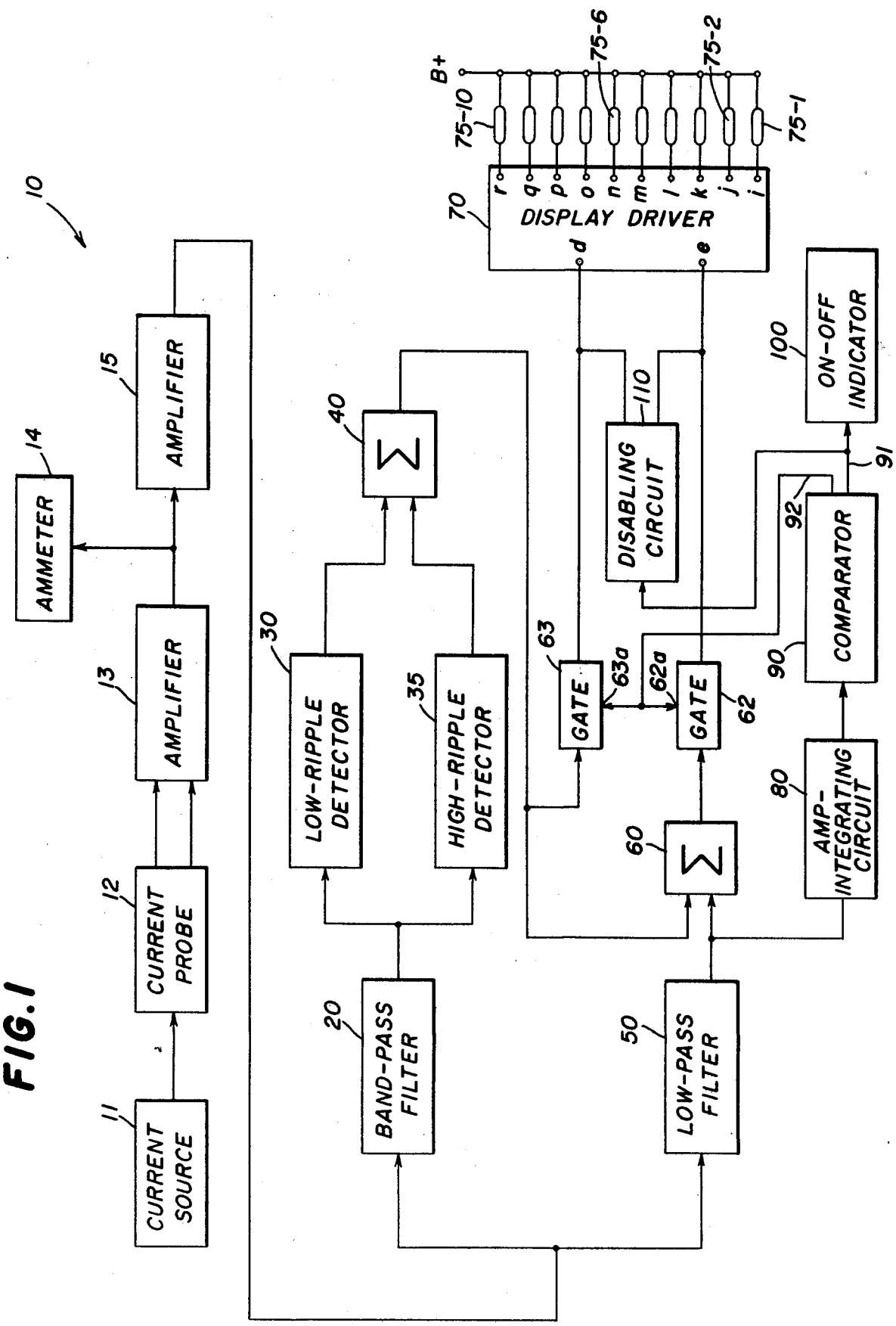
FIG. 1 depicts a block diagram of an alternator testing apparatus incorporating the features of the present invention.

Turning now to the drawings, and more particularly to FIG. 1 thereof, there is depicted an alternator testing apparatus 10 incorporating the features of the present invention. The apparatus 10 includes a current source 11 that delivers constant current to a current probe 12. The probe includes a pair of pivotally connected jaws biased to be normally closed. The jaws are opened and clamped about the cable connecting the alternator to the positive terminal of the battery. The current probe contains a Hall-effect device which produces a small voltage proportional to the magnetic field produced by current flow from the alternator. The alternator generates current having an average (or DC) component and a ripple (or AC) component. The voltage produced by the current probe 12 is applied to an amplifier 13 having gain balancing and zeroing capability. The output of this amplifier is coupled to an ammeter 14 which scales the voltage from the amplifier 13 in order to display the average or DC component of the output of the alternator. The ammeter 14 may be digital or analog in nature. The ripple or AC component of the signal is ignored by the ammeter 14 but is still present. The cause of a reading on the ammeter 14 not as high as specifications require, could be a loose belt interconnecting the engine and the alternator or the diodes may be damaged or field current may be low.

To determine whether it is the result of a defective diode, the composite signal containing both the average component and the ripple component is amplified in an amplifier 15 and applied to a band-pass filter 20. The lower cutoff frequency of the band-pass filter 20 is such as to preclude the average component in the composite signal from passing, and the upper cutoff frequency is such as to prevent passage of noise including low-frequency noise created by the regulator, high frequency noise resulting from diode switching and other types of noise created in the electrical system. In one embodiment, the lower cutoff frequency (at $-3$ db) was 50 Hz. and the upper cutoff frequency (at $-3$ db) was 1,000 Hz.

The ripple component is centered at zero volts DC and oscillates between plus and minus peaks. To determine the magnitude of the negative peaks, the ripple component is applied to a low-ripple detector 30 which produces a voltage representative of the amplitude of the negative peaks. A high-ripple detector 35 produces a voltage representative of the amplitude of the positive-going peaks. The voltages are added together in a summing circuit 40, to provide a first voltage representative of the peak-to-peak amplitude of the ripple component.

The composite signal is also applied to a low-pass filter 50 having a frequency to pass only the average component and block the ripple component. In a specific embodiment, the cutoff frequency (at $-3$ db) was 2 Hz. A summing circuit 60 has its inputs coupled to the summing circuit 40 and the low-pass filter 50, and generates a second voltage representative of the sum of the magnitude of the average component plus the amplitude of the ripple component.

The output of the summing circuit 60 is coupled through a gate 62 to the pin e of a display driver 70. Gate 62 is opened by a control signal applied to its control input 62a. A gate 63 connects the output of the summing circuit 40 to the input d of the display driver 70. The gate 63 is opened by a control signal applied to its control input 63a. When the gates 62 and 63 are closed, there appears at the terminal d a first voltage representative of the amplitude of the ripple component and there appears at the terminal e a second voltage representative of the sum of the magnitude of the average component plus the amplitude of the ripple component.

The display driver 70 operates, in a manner to be described, to divide the signal at the terminal d by the signal at the terminal e. The display driver 70 has ten output terminals i to r. Energizing current appears on the terminal i when the ratio of the voltages on the terminals d and e is 0.1. The terminal j provides energizing current when that ratio is 0.2 and so forth. The terminal r provides energizing current when the ratio is 1 which can only happen when the magnitude of the average component is zero.

The display driver 70 may be connected in a dot mode or a bar mode. In the dot mode, only one of the output terminals at a time supplies energizing current, while in the bar mode, an output terminal corresponding to a given level input will provide an energizing current as will each terminal "below" that terminal. For example, suppose a given level input causes energizing current to appear at the terminal n. In the bar mode, energizing current would be supplied by the terminals i through n. The ensuing description will focus on the dot mode although the same comments would be applicable to the bar mode.

When the alternator under test is operating properly, the ratio of the ripple component to the composite is very small so that energizing current would appear at, for example, terminals i or j. However, any damaged diodes would cause the ratio to increase substantially so that perhaps terminal p or terminal o would provide energizing current. The value of the average component, i.e. whether it was 25 amps or 100 amps, would not make any difference because a ratio having a value less than one is generated.

The output terminals i-r of the display driver 70 are respectively coupled to indicating means such as ten LEDs 75-1 to 75-10. The other terminals of the LEDs 75-1 to 75-10 are connected to B+. The LEDS having energizing current supplied to it will be illuminated.

The average component from the low-pass filter 50 is also coupled to an amplifier/integrating circuit 80 which increases the magnitude of the average component and integrates it to provide a DC control voltage. The integrating function assures that the DC control voltage will remain substantially constant despite transients or variations in the average component. The circuit 80 also includes means for adjusting the magnitude of the DC control voltage.

The circuit 80 is coupled to a comparator 90. The DC control voltage causes the comparator 90 to produce a comparator signal on the output 91 when the magnitude of the average component exceeds a predetermined level. Such comparator signal is applied to an indicator 100 to inform the serviceman that the apparatus 10 is operating even if the ripple component amplitude is so low that none of the LEDs 75-1 to 75-10 is illuminated.

Another signal from the comparator 90 appears on its output 92 when the magnitude of the AC component exceeds the predetermined level. The output 92 is coupled to the control inputs 62a and 63a of the gates 62 and 63. In the presence of a comparator signal on the output 92 the gates 62 and 63 close. As a result, a voltage representative of the ripple component is applied to pin d of the display driver 70 and a voltage representative of the sum of the average component and the ripple component is applied to pin e.

The comparator signal on the output 91 is also coupled to a disabling circuit 110. When the magnitude of the average component is less than the predetermined level, a comparator signal does not appear on the outputs 91 or 92. The absence of a comparator signal on the output 91 causes the disabling circuit 110 to apply disabling voltages to the pins d and e of the display driver 70 thereby precluding energizing current at any of the terminals i-r. The absence of a comparator signal on the output 92 causes the gates 62 and 63 to open, thereby to prevent extraneous signals from being applied to the display driver 70.

The gates 62 and 63 and the disabling circuit 110 act together to preclude any of the LEDs 75-1 to 75-10 from becoming illuminated and giving the serviceman faulty information, when the average component has a magnitude less than the predetermined level. For example, in a 30 amp alternator if the average component has a magnitude of less than 1 amp, the serviceman would have known the alternator was faulty by the reading on the ammeter 14. Insuring that none of the LEDs are illuminated in such instance prevents confusion.

The integrating portion of the circuit 80 insures that an average component having a magnitude slightly above or below the predetermined level and changing between those levels would not cause the LEDs to blink on and off, giving confusing information.

Figure 2:
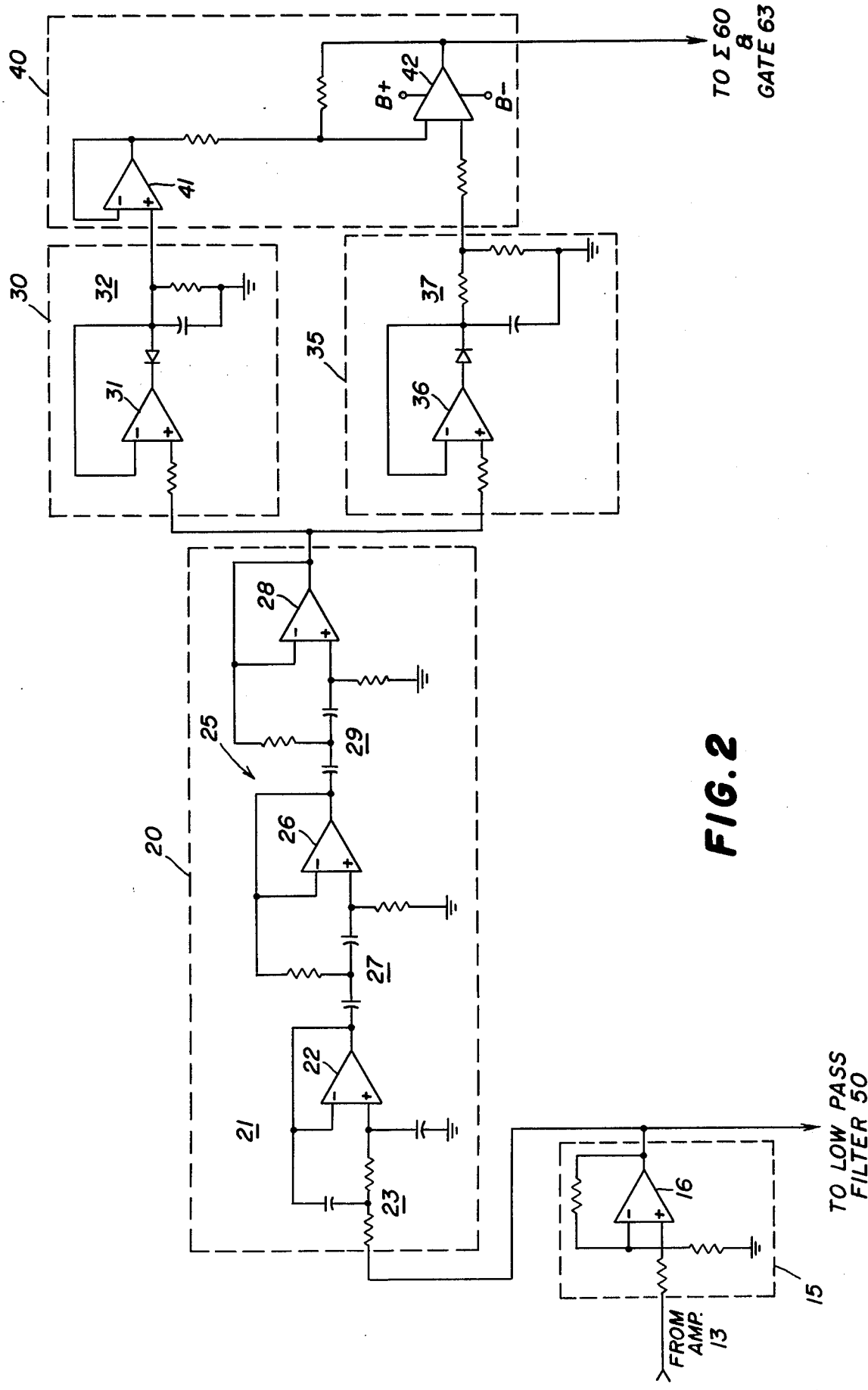
FIG. 2 depicts the circuits in some of the blocks of FIG. 1.

FIG. 2 depicts the details of certain blocks of FIG. 1. The amplifier 15 has an op amp 16 and associated biasing resistors. The band-pass filter 20 has a low-pass section 21 defined by an op amp 22 and frequency-determining components 23. The low-pass section 21 prevents passage of alternator noise spikes, ignition noise spikes, related high frequency noise, etc. The low-pass section has an upper cut-off frequency of for example 1,000 Hz. The band-pass filter 20 also includes a high-pass section 25 consisting of two stages, the first stage including an op amp 26 and frequency-determining elements 27, and the second stage including an op amp 28 and frequency-determining elements 29. The cut-off frequency of the section 25 may be 50 Hz. (at $-3$ db). The high-pass section 25 insures that the average component of the composite signal does not pass the filter 20.

The low-ripple detector 30 has an op amp 31 and a peak detector 32, the diode of which has its cathode connected to the op amp 31. With this connection, the amplitude of the negative peaks of the ripple component that passes through the filter 20 is detected. The high-ripple detector 35 includes an op amp 36 and a peak detector 37 in which the diode is connected in the reverse direction to produce a DC voltage representative of the amplitude of the positive peaks of the ripple component. The summing circuit 40 includes op amps 41 and 42 having their outputs connected in series and their inputs respectively coupled to the detectors 30 and 35.

Figure 3:
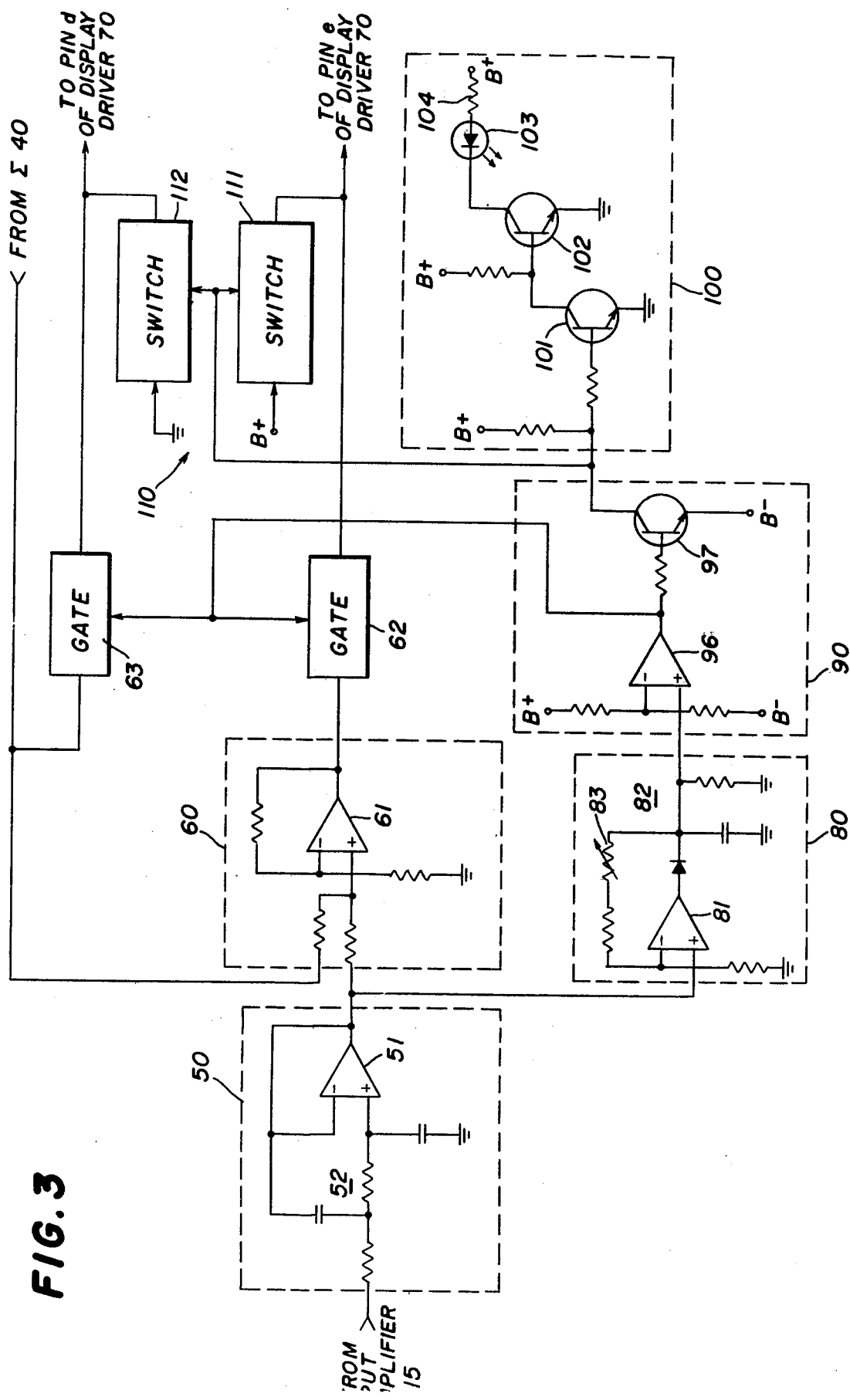
FIG. 3 depicts others of the circuits in the blocks of FIG. 1.

Others of the blocks in FIG. 1 are depicted in detail in FIG. 3. The low-pass filter 50 includes an op amp 51 and frequency-determining components 52. The cut-off frequency of the low-pass filter 50 may be 2 Hz. (at $-3$ db). The cut-off frequency is selected to allow passage only of the average component. The summing circuit 60 includes an op amp 61 having its signal inputs coupled to both the low-pass filter 50 and the summing circuit 40.

The amp/integrating circuit 80 includes an op amp 81 and an integrator 82. The amp 81 amplifies the average component from the low-pass filter 50. The integrator 82 smooths out the amplified average component so that fluctuations thereof do not affect the DC control voltage. A potentiometer 83 in the feedback circuit of the op amp 81 is adjusted to select the amplification and therefore the value of the DC control voltage. The value of the potentiometer 83 is selected such that when the magnitude of the average component falls below a predetermined level, the DC control voltage from the circuit 80 will be insufficient to operate the ensuing comparator 90, whereby none of the LEDs 75-1 to 75-10 will be illuminated.

The comparator 90 includes an op amp 96 having its control input coupled to a voltage divider to establish a threshold voltage thereat. The signal input is coupled to the circuit 80 and receives the DC control voltage therefrom. When that DC control voltage exceeds the threshold on the control input, a comparator signal is developed by the op amp 96 to open the gates 62 and 63. The output of the op amp 96 is coupled to an NPN transistor 97. The disabling circuit 110 includes a pair of electronic switches 111 and 112, the switch 111 connecting B+ to pin e of the display driver 70 and the switch 112 connecting ground to pin d of the display driver 70. In the presence of the control voltage from the circuit 80, the collector of the transistor 97 is low and both switches 111 and 112 are maintained open. When the magnitude of the average component falls below the predetermined level, the DC control voltage is insufficient to operate the comparator 90 and the gates 62 and 63 open. The collector of the transistor 97 becomes high closing the switches 111 and 112. Pin d of the display driver 70 is thereby grounded and pin e of the display driver 70 is connected to B+. The display driver 70 effectively divides the zero input at the pin d by the B+ input at the pin e guaranteeing that none of the LEDs will become illuminated.

The collector of the transistor 97 is coupled to the on/off indicator 100 which includes two NPN transistors 101 and 102 and associated biasing resistors. An LED 103 and a resistor 104 are coupled in series between the collector of the transistor 102 and B+. When the collector of the transistor 97 is low in the presence of the average component, the transistor 102 is conductive and the LED 103 turned on. This apprises the serviceman that the apparatus 10 is operating even though none of the LEDs 75-1 to 75-10 is illuminated. That could occur if the ratio of the ripple component amplitude to the composite signal amplitude was less than 0.1. If the magnitude of the average component was less than the predetermined level, the LED 103 would not become illuminated.

Figure 4:
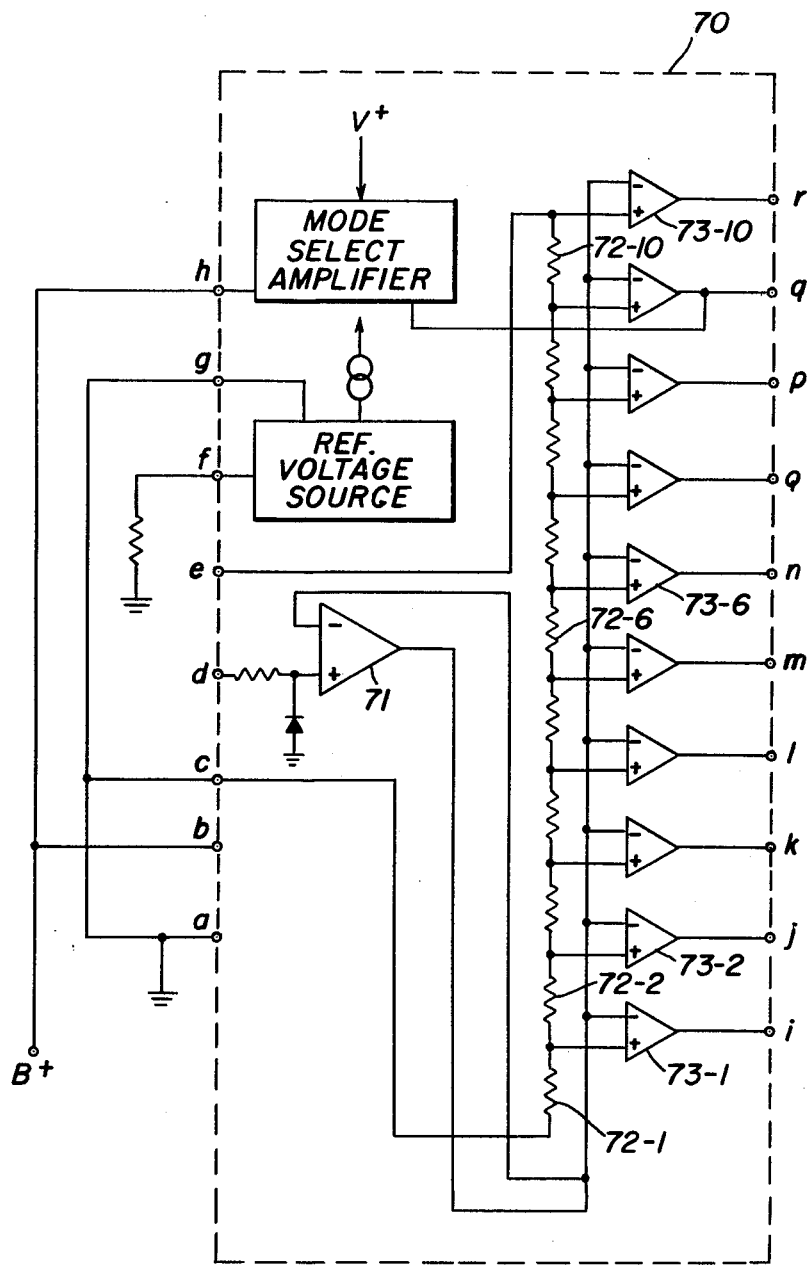
FIG. 4 depicts the details of the display driver of FIG. 1.

The display driver 70 is depicted in FIG. 4. It has pin a for connection to ground and pin b for connection to the supply voltage. Pin c is connected to one end of a series of ten equal-value resistors 72-1 to 72-10 defining a divider network, pin e being the other end of such divider network. All resistors 72-1 to 72-10 have the same value, so that 10% of the voltage at pin e is applied to the reference input of the comparator 73-1, 20% of that voltage is applied to the reference input of the comparator 73-2 and so on, 100% of the voltage applied being applied to the reference input of the comparator 73-10. In one embodiment each resistor had a value of 1K. Pin d is a signal input coupled by way of a buffer amplifier 71 to the signal inputs of ten comparators 73-1 to 73-10. Pin f is coupled to the reference voltage source and supplies power to the comparators. The greater the resistive load on pin f, the less the brightness of the LEDs in the display driven by the driver 70. Pin g controls the value of the reference voltage. Pin h is the input to the mode selector amplifier device and may be operated to furnish a dot or a bar display. For the former, as previously explained, only one LED is energized at any one instant of time, whereas to produce a bar, all LEDs up through that one LED are energized simultaneously. Finally, the display driver 70 includes ten output pins, i-r. The output pins respectively correspond to a plurality of ratios of the electrical signal applied to the input pin d to the electrical signal applied to the input pin e. For each ten percent that the ratio increases, an associated comparator will switch on providing an energizing current is on its associated output. The driver 70 is connected in its bar mode because pin h is connected to B+. In that mode, the output pin corresponding to a particular amplitude of the signal at the input d will provide an energizing current; and energizing currents will also appear on all of the output pins below that. When pin h is connected to pin q, the driver is in its dot-display mode.

In an operative embodiment, the display driver was one furnished by National Semi-Conductor under model No. LM3914.

What has been described therefore is an alternator testing apparatus which displays information on an alternator that produces current having an average component and a ripple component, the testing apparatus displaying information on the ratio of the ripple component to the composite.

We claim:

1. Alternator testing apparatus for evaluating the operation of an alternator that generates an output signal having an average component and a ripple component, comprising circuit means for generating at a first output thereof a first voltage representative of the amplitude of the ripple component and independent of the average component and for generating at a second output thereof a second voltage representative of the sum of the magnitude of the average component plus the amplitude of the ripple component, means for providing electrical signals representative of the ratio of the first voltage to the second voltage, and indicating means coupled to said providing means and being responsive to the electrical signals therefrom to provide information on the ratio.

2. The alternator testing apparatus of claim 1, wherein said indicating means is visual.

3. Alternator testing apparatus for evaluating the operation of an alternator that generates an output signal having an average component and a ripple component, comprising circuit means for generating at a first output thereof a first voltage representative of the amplitude of the ripple component and independent of the average component and for generating at a second output thereof a second voltage representative of the sum of the magnitude of the average component plus the amplitude of the ripple component, a plurality of comparators each having a signal input and a reference input and an output, said signal inputs being coupled to said first output, a divider network coupled to said second output for dividing the second voltage into a plurality of different reference voltages at a plurality of nodes in said network, said nodes being respectively coupled to said reference inputs, each comparator being activated when the first voltage exceeds the reference voltage associated with such comparator, and indicating means coupled to said comparator outputs and being energized in accordance with which comparator is activated.

4. The alternator testing apparatus of claim 3, wherein said plurality of comparators and said divider network are part of an integrated circuit.

5. The alternator testing apparatus of claim 3, and further comprising further circuit means coupled to the signal inputs of said comparators and to said divider network and being operative to allow the first and second voltages to be applied thereto only in the presence of an output signal of predetermined amplitude.

6. The alternator testing apparatus of claim 3, and further comprising a disabling circuit coupled to the signal inputs of said comparators and to said divider network and being responsive to the absence of an output signal of predetermined amplitude to disable said comparators.

7. The alternator testing apparatus of claim 3, and further comprising first gate means coupling the first output of said circuit means to the signal inputs of said comparators, second gate means coupling the second output of said circuit means to said divider network, said first and second gate means being operative to couple the first and second voltages respectively to said comparators and to said divider network in the presence of an output signal of predetermined amplitude.

8. The alternator testing apparatus of claim 3, wherein said divider network includes a plurality of resistors connected in series between the reference input of one of said comparators and a point of reference potential, the junctions of said resistors being respectively coupled to the reference inputs of the rest of said comparators, said second output being coupled to the reference input of said one comparator.

9. The alternator testing apparatus of claim 8 wherein each of said resistors has substantially the same value.

10. Alternator testing apparatus for evaluating the operation of an alternator that generates an output signal having an average component and a ripple component, comprising first filter means for receiving the output signal for passing the ripple component thereof, detector means coupled to said first filter means for generating a first voltage representative of the amplitude of the ripple component, second filter means coupled to receive the output signal for passing the average component, summing means coupled to said detector means and to said second filter means for generating a second voltage representative of the sum of the magnitude of the average component and the amplitude of the ripple component, a plurality of comparators each having a signal input and a reference input and an output, said signal inputs being coupled together and to said detector means, a divider network coupled to said summing means for dividing the second voltage into a plurality of different reference voltages at a plurality of nodes in said network, said nodes being respectively coupled to said reference inputs, each comparator being activated when the first voltage exceeds the reference voltage associated with such comparator, and indicating means coupled to said comparator outputs and being energized in accordance with which comparator is activated.

11. The alternator testing apparatus of claim 10, wherein said first filter means is a band-pass filter which allows passage of the ripple component and not the average component.

12. The alternator testing apparatus of claim 11, wherein the pass band of said band-pass filter is on the order of about 50 to 1,000 Hz.

13. The alternator testing apparatus of claim 10, wherein said second filter means is a low-pass filter having a cut-off frequency on the order of about 2 Hz.

14. The alternator testing apparatus of claim 10, and further comprising first gate means coupling said detector means to the signal inputs of said comparators, second gate means coupling said summing means to said divider network, each of said gate means having a control input coupled to said second filter means, said first gate means being operative to couple the first voltage to said comparators in the presence of an average component of predetermined amplitude, said second gate means being operative to couple the second voltage to said divider network in the presence of an average component of predetermined amplitude.

15. The alternator testing apparatus of claim 10, and further comprising a disabling circuit coupled to the signal inputs of said comparators and to said divider network and having a control input coupled to said second filter means, said disabling circuit being responsive to the absence of an average component of predetermined amplitude to disable said comparators.

16. The alternator testing apparatus of claim 10, wherein said indicating means is a plurality of LEDs respectively coupled to said comparator outputs.

17. Alternator testing apparatus for evaluating the operation of an alternator that generates an output signal having an average component and a ripple component, comprising first filter means coupled to receive the output signal for passing the ripple component, low-ripple detector means coupled to said first filter means for generating a low-ripple detector voltage representative of the amplitude of the negative-going peaks of the ripple component, high-ripple detector means coupled to said first filter means for generating a high-ripple detector voltage representative of the amplitude of the positive-going peaks of the ripple component, first summing means coupled to said low-ripple detector means and to said high-ripple detector means for adding the detector voltages therefrom and providing a first voltage representative of the peak-to-peak amplitude of the ripple component, second filter means coupled to receive the output signal for passing the average component, second summing means coupled to said first summing means and to said second filter means for generating a second voltage representative of the sum of the magnitude of the average component plus the amplitude of the ripple component, a plurality of comparators each having a signal input and a reference input and an output, said signal inputs being coupled to said first summing means, a divider network coupled to said second summing means for dividing the second voltage into a plurality of different reference voltages at a plurality of nodes in said network, said nodes being respectively coupled to said reference inputs, each comparator being activated when the first voltage exceeds the reference voltage associated with such comparator, and indicating means coupled to said comparator outputs and being energized in accordance with which comparator is activated.

18. Alternator testing apparatus for evaluating the operation of an alternator that generates an output signal having an average component and a ripple component, comprising first filter means coupled to receive the output signal for passing the ripple component, detector means coupled to said first filter means for generating a first voltage representative of the amplitude of the ripple component, second filter means coupled to receive the output signal for passing the average component, summing means coupled to said detector means and to said second filter means for generating a second voltage representative of the sum of the magnitude of the average component plus the amplitude of the ripple component, a plurality of display comparators each having a signal input and a reference input and an output, first gate means coupling said detector means to the signal inputs of said display comparators, second gate means coupled to said summing means, each of said gate means having a control input coupled to said second filter means, a divider network coupled to said second gate means for dividing the second voltage into a plurality of different reference voltages at a plurality of nodes in said network, said nodes being respectively coupled to said reference inputs, each display comparator being activated when the first voltage exceeds the reference voltage associated with such display comparator, indicating means coupled to said display comparator outputs and being energized in accordance with which display comparator is activated, and a control comparator coupled to said second filter means and being operative in the presence of an average component exceeding a predetermined amplitude to provide a comparator signal, the control inputs of said gate means being coupled to said control comparator, said first gate means being operative to couple the first voltage to said display comparator in the presence of the comparator signal, said second gate means being operative to couple the second voltage to said divider network in the presence of the comparator signal.

19. The alternator testing apparatus of claim 18, and further comprising a disabling circuit coupled to the signal inputs of said display comparators and to said divider network and having a control input coupled to said control comparator, said disabling circuit being responsive to the absence of the comparator signal to disable said display comparators.

20. The alternator testing apparatus of claim 18, and further comprising means coupled between said second filter means and said control comparator for amplifying and integrating the average component before coupling to said control comparator.

21. The alternator testing apparatus of claim 18, and further comprising means coupled to said comparator for giving a visual indication of the presence of the comparator signal.

22. Alternator testing apparatus for evaluating the operation of an alternator that generates an output signal having an average component and a ripple component, comprising circuit means for generating at a first output thereof a first voltage representative of the amplitude of the ripple component and independent of the average component and for generating at a second output thereof a second voltage representative of at least the magnitude of the average component, means for providing electrical signals representative of the ratio of the first voltage to the second voltage, and indicating means coupled to said providing means and being responsive to the electrical signals therefrom to provide information on the ratio.

23. Alternator testing apparatus for evaluating the operation of an alternator that generates an output signal having an average component and a ripple component, comprising circuit means for generating at a first output thereof a first voltage representative of the amplitude of the ripple component and independent of the average component and for generating at a second output thereof a second voltage representative of at least the magnitude of the average component, a plurality of comparators each having a signal input and a reference input and an output, said signal inputs being coupled to said first output, a divider network coupled to said second output for dividing the second voltage into a plurality of different reference voltages at a plurality of nodes in said network, said nodes being respectively coupled to said reference inputs, each comparator being activated when the first voltage exceeds the reference voltage associated with such comparator, and indicating means coupled to said comparator outputs and being energized in accordance with which comparator is activated.

* * * * *